(12) United States Patent
Geske et al.

(10) Patent No.: US 8,743,923 B2
(45) Date of Patent: Jun. 3, 2014

(54) MULTI-WAVELENGTH VCSEL ARRAY TO REDUCE SPECKLE

(75) Inventors: Jonathan Geske, Ventura, CA (US); Chad Wang, Santa Barbara, CA (US); Elliot Burke, Goleta, CA (US)

(73) Assignee: FLIR Systems Inc., Wilsonville, OR (US)

(*) Notice: Subject to any disclaimer, the term of this patent is extended or adjusted under 35 U.S.C. 154(b) by 60 days.

(21) Appl. No.: 13/363,181

(22) Filed: Jan. 31, 2012

(65) Prior Publication Data
US 2013/0194787 A1    Aug. 1, 2013

(51) Int. Cl.
*H01S 5/00* (2006.01)

(52) U.S. Cl.
USPC ........ 372/50.12; 372/8; 372/50.124; 372/108

(58) Field of Classification Search
USPC ...................................... 372/8, 50.12, 50.124
See application file for complete search history.

(56) References Cited

U.S. PATENT DOCUMENTS

| | | | |
|---|---|---|---|
| 5,909,614 A * | 6/1999 | Krivoshlykov | 438/29 |
| 5,960,024 A | 9/1999 | Li et al. | |
| 6,789,957 B1 * | 9/2004 | Colgan et al. | 385/89 |
| 2002/0186737 A1 | 12/2002 | Marion | |
| 2003/0030919 A1 * | 2/2003 | Pezeshki | 359/726 |
| 2007/0273957 A1 * | 11/2007 | Zalevsky et al. | 359/326 |
| 2008/0192259 A1 | 8/2008 | Sumiyama | |
| 2012/0120977 A1 * | 5/2012 | Fattal et al. | 372/50.11 |
| 2012/0268727 A1 * | 10/2012 | Schrey et al. | 356/5.01 |
| 2013/0182322 A1 * | 7/2013 | Silverstein | 359/464 |

FOREIGN PATENT DOCUMENTS

WO    WO 2011/093883    8/2011

OTHER PUBLICATIONS

Geske et al, "High Power VCSELs for miniature optical sensors", Proceedings of SPIE, Feb. 5, 2010, vol. 7615, p. 76150E-2.

* cited by examiner

*Primary Examiner* — Dung Nguyen
(74) *Attorney, Agent, or Firm* — Haynes and Boone, LLP

(57) ABSTRACT

Embodiments of the invention describe an illuminator having a light source to originate an illumination beam, wherein the light source further comprises a set of vertical-cavity surface emitting lasers (VCSELs), including a first VCSEL having a first laser emission wavelength, and a second VCSEL having a second laser emission wavelength different than the first laser emission wavelength. Thus, by varying laser emission wavelengths of VCSELs in a VCSEL array, embodiments of the invention produce low-contrast speckle, and do not limit the imaging capabilities of the host illumination system. In some embodiments of the invention, vertical external cavity surface emitting lasers (VECSELs) are utilized to produce the above described varying laser emission wavelengths.

20 Claims, 8 Drawing Sheets

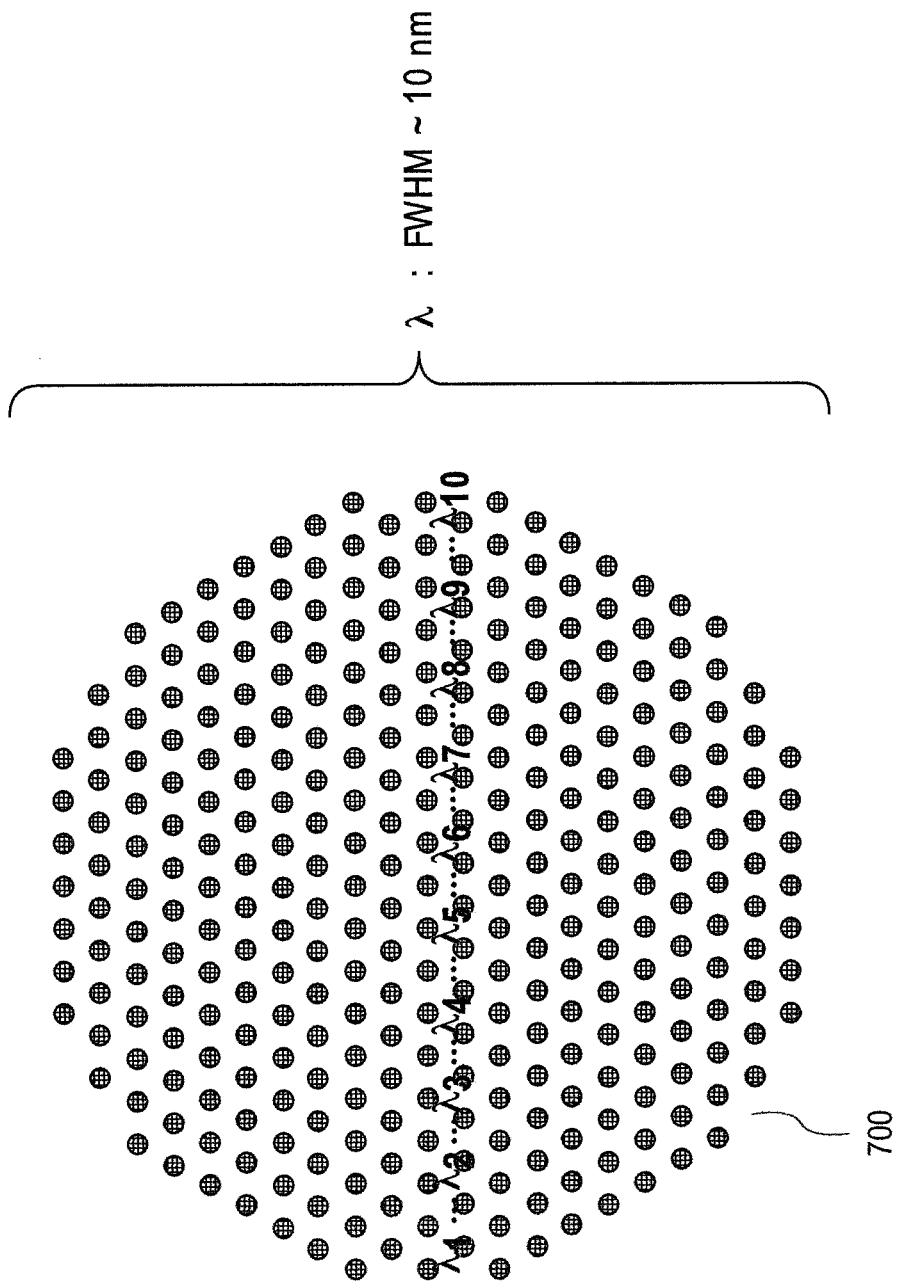

MULTI-WAVELENGTH VCSEL ARRAY TO REDUCE SPECKLE

FIELD

Embodiments of the invention generally pertain to speckle reduction in laser illumination, and more particularly to the use of multi-wavelength vertical-cavity surface emitting lasers (VCSELs) to reduce speckle.

BACKGROUND

Illumination systems include a light source and illumination optics for transferring light from the light source to a desired destination. Light from the light source is projected to a target, and the light reflected back is collected to form an image. The light source in an illumination system may be, for example, a light emitting diode (LED) or a laser. Laser light is inherently narrow band and gives rise to the perception of fully-saturated colors and unfortunately, narrow band light incident on random surfaces introduces an unacceptable image artifact known as "speckle."

Speckle (or speckle noise) may exist when one or more coherent light sources, such as laser light sources, are used in an illumination system. Speckle is typically randomized interference and a characteristic of coherent imaging.

The visual effects of speckle detract from the aesthetic quality of an image and also result in a reduction of image resolution. A variety of "de-speckling" techniques known in the art can be used to reduce this artifact to "acceptable levels," but only at the expense of system efficiency, which negatively impacts cost, reliability, package size, and power consumption.

Semiconductor lasers can be used to emit light in the near infrared wavelength range for illumination applications such as night-vision, covert surveillance, or industrial illumination. One particular structure of a semiconductor laser is a vertical-cavity surface emitting laser (VCSEL), where light emits perpendicular to the surface of the wafer plane. This vertical structure of the VCSEL lends itself easily towards building 2D arrays with high output power and low beam divergence, and the light from each VCSEL emitter element in the array can be easily collimated and used to build an efficient laser illuminator.

In the prior art, each VCSEL in an array tends to have very close to the same wavelength. This is due to the close proximity of the emitter elements within the array and the uniform wafer characteristics of the epitaxially grown laser structure. Therefore the individual VCSELs in the 2D array form speckle patterns that are nearly identical. These patterns combine to form high contrast speckle. High contrast speckle results in high levels of noise in the image, and limits the ability of an imaging system to resolve fine spatial detail. At worst, without some form of correction, speckle can make coherent illumination unsuitable for display purposes.

When operating near the noise floor of the system, such speckle noise can have a pronounced impact. Current techniques used to break speckle noise, such as utilizing vibrating diffusers and fiber stretchers, can actually introduce additional artifacts that reduce the image quality.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 7A is an illustration of a 2D VCSEL array emission format according to an embodiment of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe an illuminator having a light source to originate an illumination beam, wherein the light source further comprises a set of vertical-cavity surface emitting lasers (VCSELs) having varying laser emission wavelengths. It is to be understood in view of the description below that, by varying laser emission wavelengths of VCSELs in a VCSEL array, embodiments of the invention produce low-contrast speckle without limiting the imaging capabilities of the host illumination system. In some embodiments of the invention, vertical external cavity surface emitting lasers (VECSELs) (which, as referred to herein, are to be understood as type of VCSEL), are utilized to produce the above described varying laser emission wavelengths.

The VCSEL-based illuminators described by embodiments of the invention may use robust single-chip spectral interleaving approaches as described below. While each VCSEL in the array has a narrow bandwidth, each VCSEL in embodiments of the invention may be engineered to have a different wavelength based on various fabrication processes. Thus the individual speckle patterns generated by said VCSEL arrays have a low correlation, and the large number of VCSELS in an array average out to a uniform background.

Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
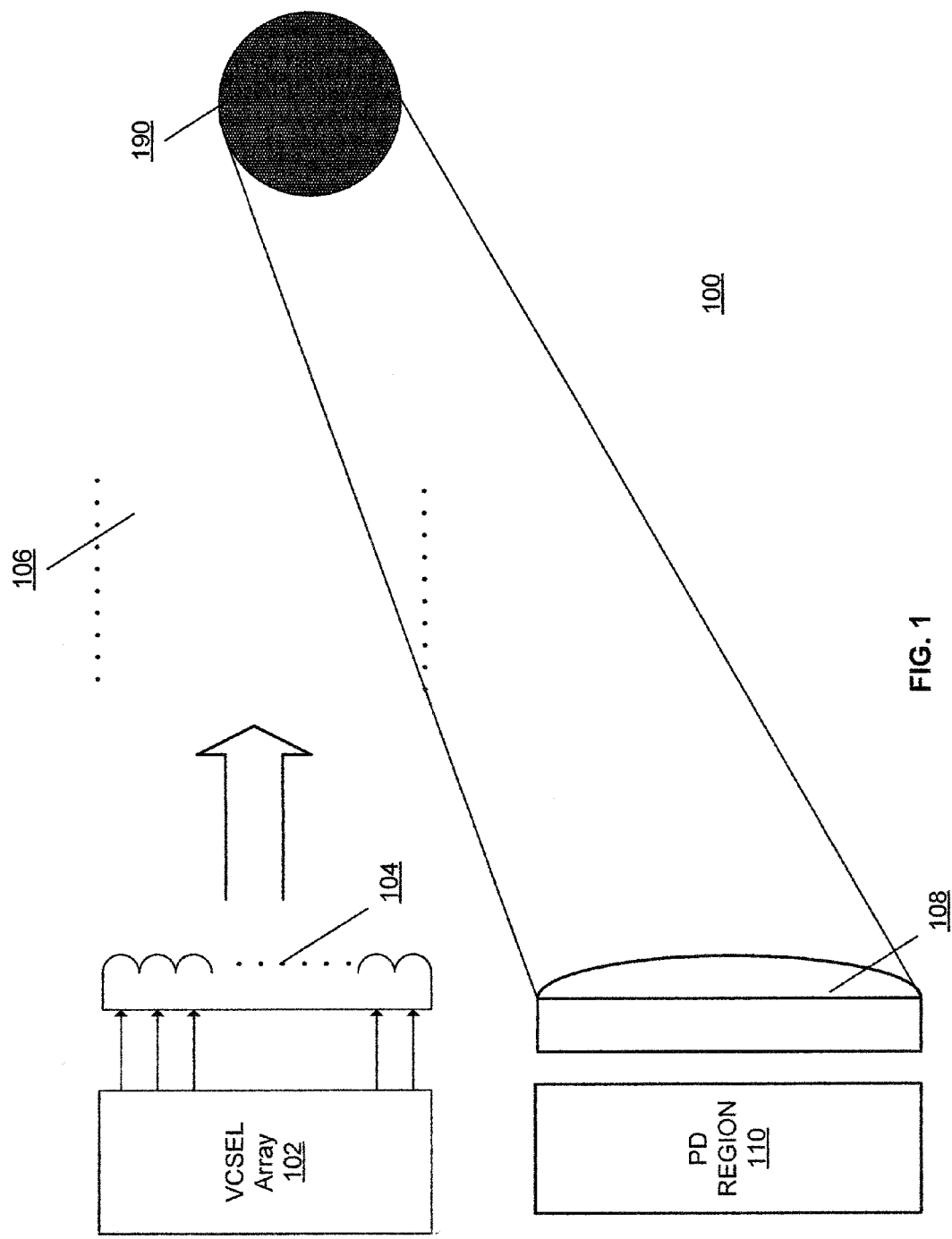
FIG. 1 is a block diagram of an illumination and imaging system according to an embodiment of the invention.

FIG. 1 is a block diagram of an illumination and imaging system according to an embodiment of the invention. Illumination is used in order to provide photons necessary for a person or a camera to see a scene, for example, imaging a scene with a near-infrared (700 nm to 1.1 um) or short-wave infrared (800 nm to 1.7 um) camera. Illumination is also used to provide hyper-spectral illumination for hyper-spectral imaging.

In this embodiment, system 100 may be used for illumination applications such as night-vision, covert surveillance, or industrial illumination. System 100 includes laser light source 102, which includes a 2D VCSEL array. It is understood that the vertical structure of a VCSEL lends itself easily towards building 2D arrays with high output power and low beam divergence. Furthermore, the arrangement of the VCSELs in the 2D array creates light that may be easily collimated and used to build an efficient laser illuminator.

System 100 further includes microlens array 104, aligned with each VCSEL of light source 102, to collimate the generated light. The resultant collimated light is directed towards object 190 within in field of view 106 to illuminate said object.

System 100 may further include imaging optics configured to receive light from the illumination beam reflected from a surface of object 190. In this embodiment, said imaging optics are shown to include lens assembly 108 for focusing light on photosensitive or photodiode ("PD") region 110 to produce an image.

Determining speckle noise in the produced image is a complex assessment that includes the laser illuminator parameters, the imager parameters, and details related to the target surface depth within a resolved pixel of the sensor. At its most basic characterization, speckle is influenced by the relative spatial coherence of laser light source 102, the spectral coherence of said light source with respect to the depth of target 190, and details related to unintentional coherent interactions within the VCSEL array of laser light source 102. Objective speckle is formed by the reflection of coherent light from a rough surface onto a second surface. The second surface contains speckle whose properties are not a function of the viewing optics. Subjective speckle is formed when the first illuminated surface is viewed by an optical system (e.g., an eye or camera lens). The subjective speckle is formed on the image plane and is a function of the lens position, focal length, aperture size, and detailed design.

Prior art VCSEL arrays tend to include VCSELs having the same lasing emission wavelength, due to the close proximity of the emitter elements within the array and the uniform wafer characteristics of the epitaxially grown laser structure. Therefore the individual VCSELs in the 2D array may form speckle patterns in the produced image that are nearly identical, thereby forming high contrast speckle. It is understood that high contrast speckle results in high levels of noise in the image, and limits the ability of an imaging system to resolve fine spatial detail. Thus, laser light source 102 is designed to include an array of VCSELs having differing lasing emission wavelengths as described below. It is to be understood that such VCSEL arrays according to embodiments of the invention produce low-contrast speckle, and do not limit the imaging capabilities of system 100.

Figure 2:
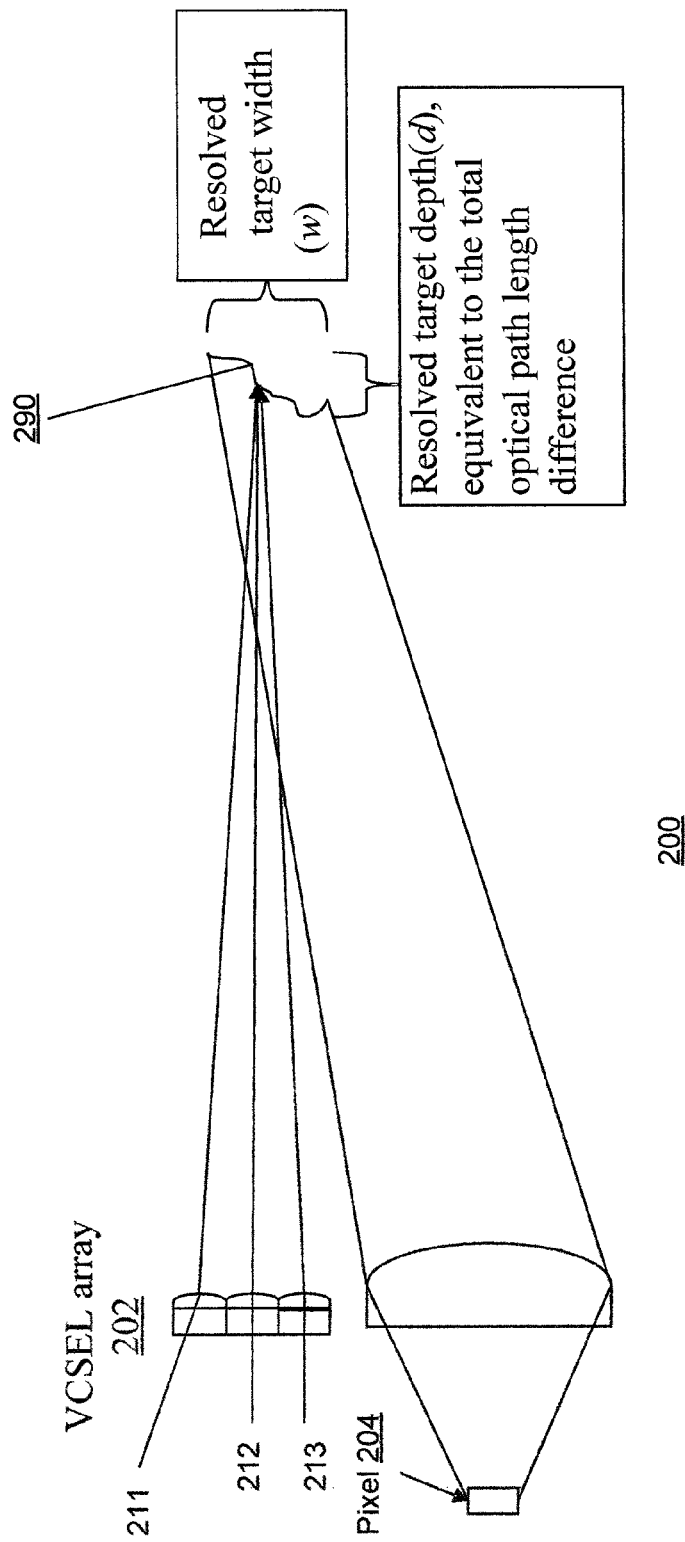
FIG. 2 is a block diagram of a laser light source and an image pixel according to an embodiment of the invention.

FIG. 2 is a block diagram of a laser light source and an image pixel according to an embodiment of the invention. In this embodiment, imager subsystem 200 is shown to include VCSEL array 202 and imager pixel 204 used to capture imaging information for target 290. In this figure, VCSEL array 202 is shown to include three VCSELs (211, 212 and 213). It is to be understood that in other embodiments of the invention, said VCSEL array may include many more VCSELs.

Imager pixel 204 as illustrated may be one of a plurality of imager pixels, or may be included in a single pixel device (e.g., an infrared distance measuring device such as a range finder). It is understood that in, for example, short-wave infrared (SWIR) target recognition and identification applications at long ranges, a user is typically dealing with situations where the imager resolution limited sampling distance on target 290 is on the order of 2-4 cm (w in FIG. 2). In such a situation, prior art VCSEL arrays operating at a long range will essentially illuminate each width of the target w from what appears to be the same location. It is understood that such real-world targets likely have depth that varies by on the order of a millimeter (d in FIG. 2) across the width of the resolved area w.

For SWIR imaging systems designed to work over broad spectral ranges, one may be operating with a lens design that has the size of the Airy disk nearly the same as the pixel pitch in the imager. This is especially true as SWIR imagers move toward 10 micron and smaller pixels. Thus with laser illuminators in general, when illuminating targets at long ranges (e.g., hundreds of meters), the small laser exit aperture leads to a situation where the laser has a large amount of spatial coherence and this spatial coherence generates a speckle structure that is the size of, or just larger than, the Airy pattern on the imager (although speckle structures may have a wide range of sizes—it may be as small as the Airy disk or several times larger; significant amounts of speckle will be seen for pixel sizes significantly larger than the Airy disk).

Hence, it is very probable that under some situations laser illumination can be expected to produce speckle that will be resolved by the imager and hence will degrade the image. Thus spatial coherence is a problem with illuminators in general; this problem is addressed by embodiments of the invention described below, which further address and reduce speckle interference.

Due to the spatial coherence of VCSEL arrays, embodiments of the invention may vary the optical path length for the ensemble of VCSEL array 202 such that VCSELs 211-213 vary by at least one wavelength in order to for the interference pattern on the imager to average out within pixel 204 to avoid pixel-to-pixel intensity artifacts. In one embodiment, the optimal wavelength difference is determined by the equation:

$$\frac{d}{\lambda} - \frac{d}{\lambda + \Delta\lambda} \approx \frac{d \cdot \Delta\lambda}{\lambda^2} \geq 1$$

The above equation shows the relationship for the coherent interference is to just average out across pixel 204. For a wavelength of 1 micron and a depth, d, of 1 mm (i.e., this depth equating to the total path length variation of the reflected light from object 290 to pixel 204 of the imager subsystem 200), the $\Delta\lambda$ utilized may be about 1 nm. In this example, this may be the minimum condition, and also the condition for 1 mm of depth across pixel 204. In other embodiments, it is understood that for uniform cancellation of speckle noise, even from an array of VCSELs, a spectral bandwidth value several times 1 nm may be desirable.

Figure 3:
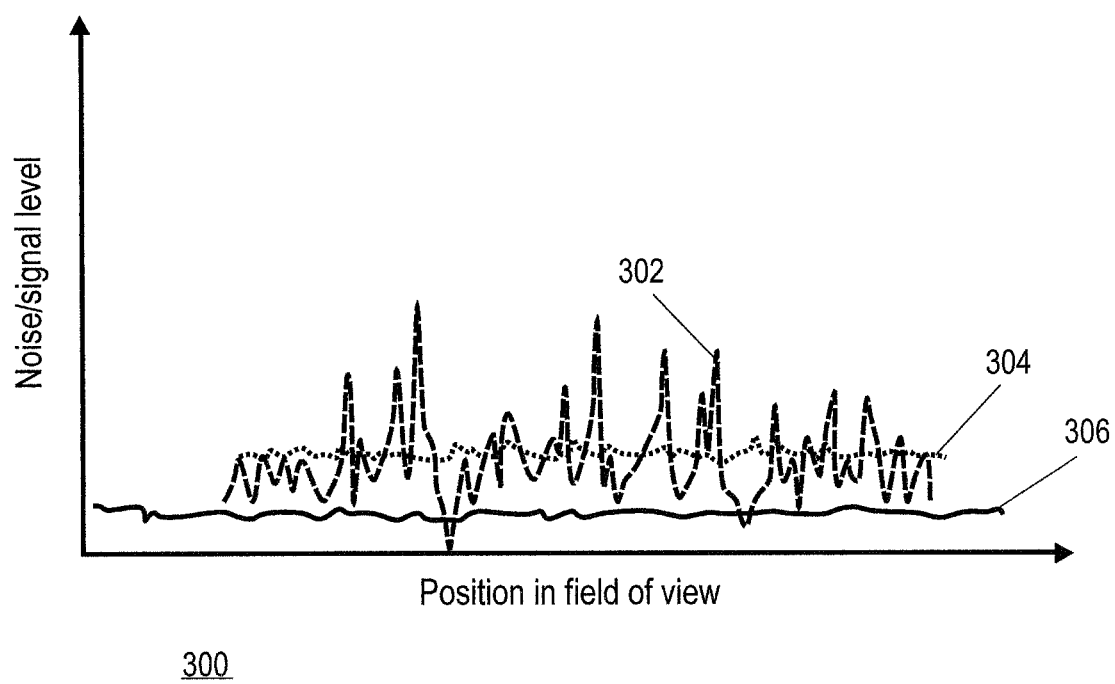
FIG. 3 is a graph comparing noise generated based on speckle for systems utilizing the prior art and embodiments of the invention.

FIG. 3 is a graph comparing noise generated based on speckle for systems utilizing the prior art and embodiments of the invention. Graph 300 includes curve 302 illustrating prior art illuminator speckle/artifacts, curve 304 illustrating speckle/artifacts generated by an embodiment of the invention, and curve 306 shows camera noise generated by the host illumination system itself The small size and narrow spectral bandwidth of the lasers can cause speckle to be seen when viewing the illuminated object, as is common in laser illumination. Speckle is caused by the interaction of the laser energy with the optical surfaces that the laser energy encounters on its path from the laser aperture to the target and back to the eye or camera photon collection surface (i.e., retina or the camera focal plane array, respectively). Optical interference between the photons causes the appearance of bright and dark spots in the laser illuminated scene to be perceived by the camera or the eye. In low light levels, this optical interference, or speckle noise, reduces the clarity of the image and hence reduces the utility of the laser illumination for providing better visibility in low light or for providing optical energy for hyper-spectral imaging.

As can be seen in curve 302, speckle is highly undesirable because its high contrast masks the detection of elements in the scene being illuminated. Curve 302 further shows how speckle can lead to the appearance of large amounts of additional noise when the light level in a scene is low and hence the noise due to the speckle moves the perceived pixels of the image in and out of the noise floor (i.e., curve 306) of the image.

Thus, curve 302 shows how the intensity noise detected in a row of pixels can dominate when operating near the noise floor of the imager, as is typical in low-light situations at long ranges. Curve 304 shows that by reducing the illuminator artifacts utilizing any of the embodiments of the invention described herein, the dominant signal can be restored to the scene that is being illuminated away from the noise of the illuminator itself (i.e., curve 306).

Figure 4:
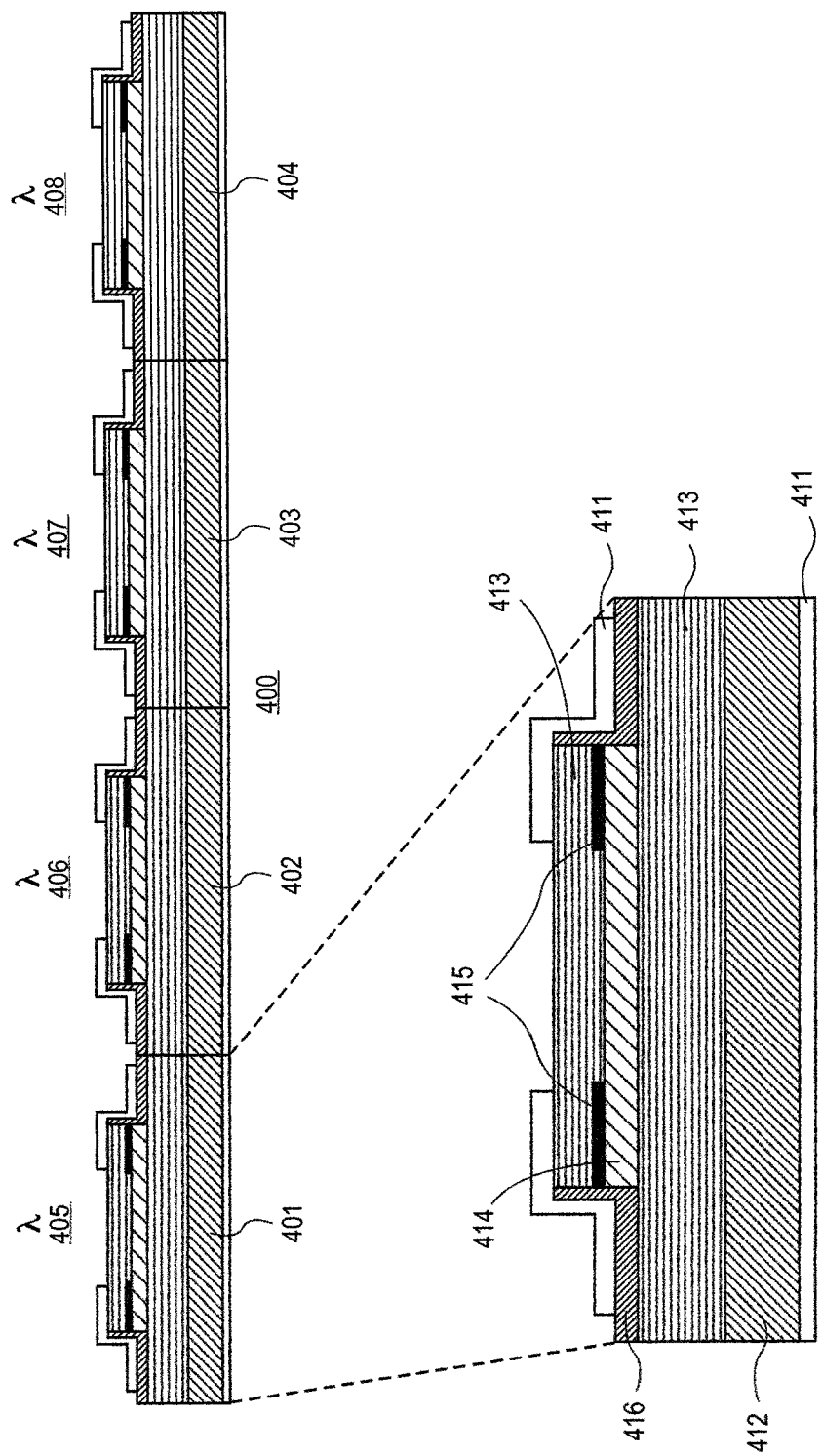
FIG. 4 is a cross-section schematic of a VCSEL array where the emission wavelength of each element within the array is different in accordance with an embodiment of the invention.

FIG. 4 is a cross-section schematic of a VCSEL array where the emission wavelength of each element within the array is different in accordance with an embodiment of the invention. In this embodiment, VCSEL array 400 is shown to include VCSELs 401, 402, 403 and 404. Said VCSELs each have varying lasing emission wavelengths 405, 406, 407 and 408, respectively. In this illustration, each of said VCSELs are top-emitting VCSELs. Other embodiments of the invention may utilize bottom emitting VCSELs.

FIG. 4 further includes a magnified illustration of VCSEL 401 to show its components, including complementary electrodes 411, semiconductor substrate 412, 1st and 2nd reflectors 413, gain region 414, and aperture formation regions 415. In this illustrated embodiments, VCSEL 401 is shown to further include isolation layer 416 disposed between an electrode and a reflector. It is to be understood that VCSELs 402-404 as illustrated include similar components.

In some embodiments of the invention, each of VCSELs 401-404 may include structural variations in any of the above described components to produce varying lasing emission wavelengths. For example, in some embodiments of the invention, each of VCSELs 401-404 may have different cavity lengths. It is to be understood that varying said laser cavity lengths varies the respective VCSELs' laser oscillator lengths. This may be accomplished, for example, by mirror deposition variation, material thickness trimming, the use of unique gratings, or any combination of these processes.

In other embodiments, each of VCSELs 401-404 may utilize a set of mirrors to define different resonant cavities, which will result in varying lasing emission wavelengths 405-408. In other embodiments, each of the reflectors of VCSELs 401-404 (such as reflectors 413 of VCSEL 401) may comprise one or more distributed Bragg reflectors (DBRs), wherein said DBRs are used to form a different effective optical path length for each VCSEL. In these embodiments of the invention, said reflectors may comprise any DBR configuration to form varying effective optical path lengths—e.g., a 1st DBR paired with an opposing dielectric DBR, a semiconductor DBR, an optical grating, etc. In other embodiments, each of VCSELs 401-404 may include variable sets of gratings to produce varying lasing emission wavelengths 405-408.

In some embodiments of the invention, each of VCSELs 401-404 may be processed to include designed structural variations (for example, varying aperture formation regions such as regions 415 of VCSEL 401 to vary their emitter diameters) such that they possess a different and unique mode structure and/or volume, thereby generating differing wavelengths 405-408.

In other embodiments of the invention, each of VCSELs 401-404 may include active cavity regions (such as gain region 414 and aperture formation region 415 of VCSEL 401) comprising different refractive indexes. Index of refraction variation within VCSEL array 400 may be accomplished by using tapered oxidation layers or other tapered or modulated dielectric or semiconductor layers.

In other embodiments of the invention, thermal approaches may be used to spectrally broaden VCSEL array 400 for low-speckle. It is to be understood that temperature variations across VCSELs 401-404 will induce changes in lasing wavelengths 405-408 due to wavelength drift. This may be accomplished by patterned heat spreaders, solders, or current injection gradient techniques.

Figure 5:
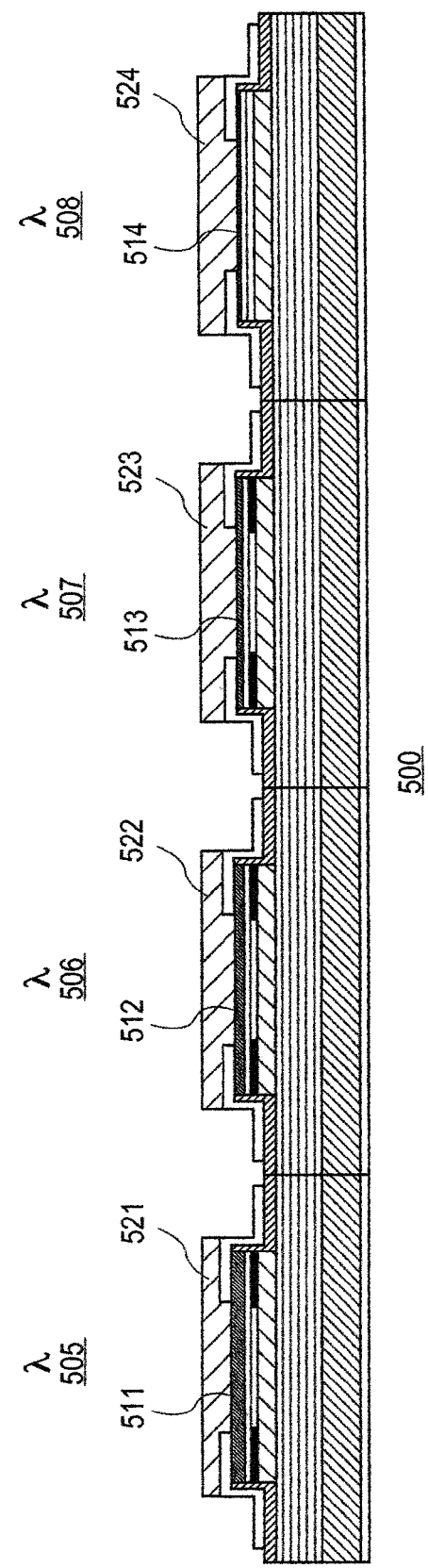
FIG. 5 is a diagram of an array of VCSELs with varying optical cavity lengths according to an embodiment of the invention.

FIG. 5 is a diagram of an array of VCSELs with varying optical cavity lengths according to an embodiment of the invention. In this embodiment, each of VCSELs 501, 502 503 and 504 include variations to the same intra-cavity structure component to produce varying laser emission wavelengths 505, 506, 507 and 508, respectively.

In this embodiment, layers 511, 512, 513 and 514 are shown to be progressively thinner in order to change the optical cavity length of VCSELs 501, 502, 503 and 504, respectively, thereby allowing for variations in laser emission wavelengths 505-508. For example, in embodiments where the reflectors of VCSELs 501-504 comprise DBRs formed from gallium arsenide (GaAs) and aluminum gallium arsenide (AlGaAs), each of layers 511-514 may be thinning layers of GaAs used in conjunction with dielectric DBRs above each device, 521, 522, 523 and 524, thereby allowing for variations in laser emission wavelengths 505-508 respectively.

Thus in the above described embodiments of the invention, because VCSELs 501-504 oscillate in a single longitudinal mode (with a narrow spectrum bandwidth and thereby emit a beam having a small angle of divergence), differing structural characteristics between each VCSEL changes the wavelength (i.e., wavelengths 505-508) of the longitudinal mode of each respective VCSEL. In other embodiments of the invention implemented in an array of VCSELs wherein each VCSEL has multiple selectable longitudinal modes, mechanisms are utilized so that VCSELs within the array select different longitudinal modes.

Figure 6:
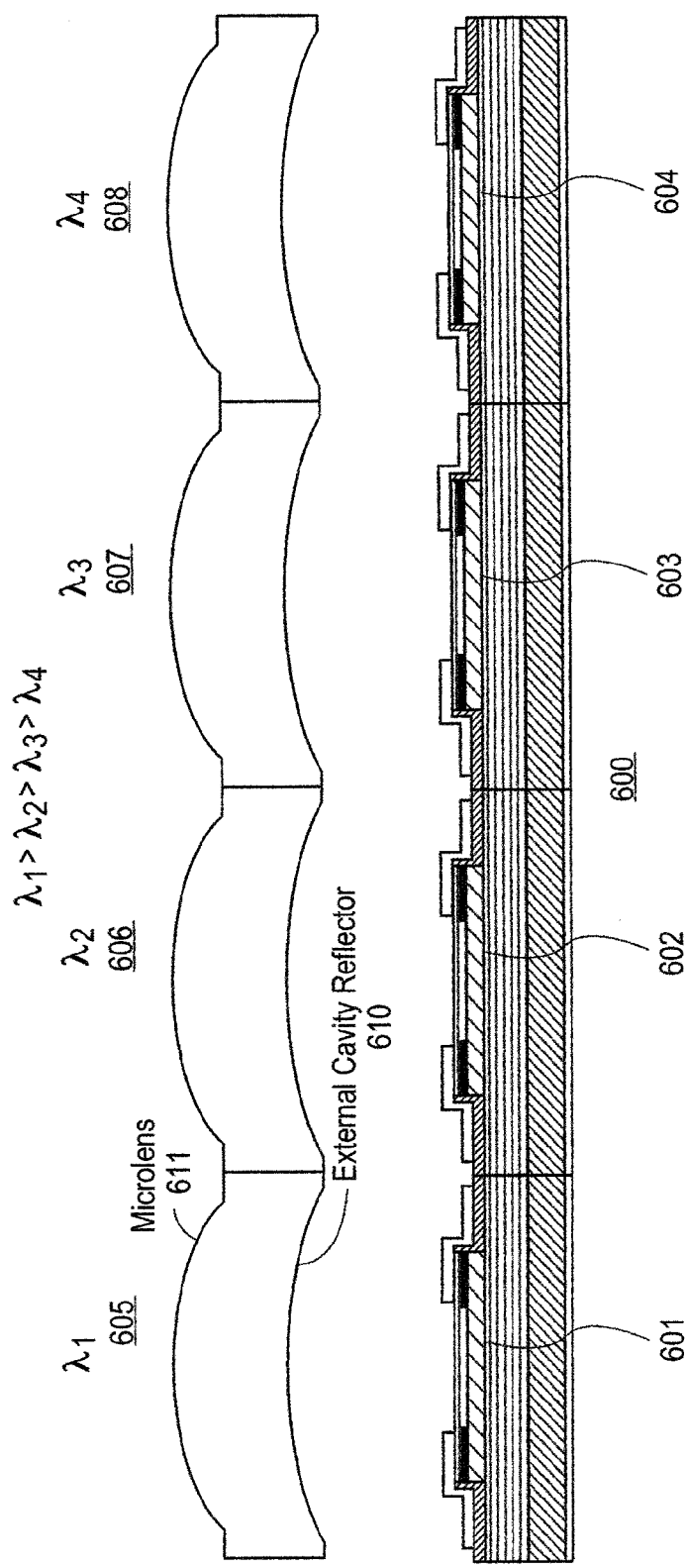
FIG. 6 is a diagram of an array of VESCELs where the emission wavelength of each element within the array is different in accordance with an embodiment of the invention.

FIG. 6 is a diagram of an array of VESCELs where the emission wavelength of each element within the array is different in accordance with an embodiment of the invention. In this embodiment, VECSELs 601, 602, 603 and 604 of array 600 are structurally similar to VCSELs 401-404 of array 400, except each of said VECSELs separates one (or both) mirrors from the semiconductor substrate by replacing an upper mirror of the structure formed on a corresponding substrate (such as top reflector 413 of VCSEL 401) with a reflective material external to the cavity—shown here as external cavity reflector 610 formed along with microlens 611. Said external cavity reflector is formed to be separate from the remaining structure of VECSELs 601-604, and thus obtains a high output power and supports multiple longitudinal modes.

Embodiments of the invention may utilize various mechanisms to select different supported longitudinal modes for each of VECSELs 601-604. For example, the regions of external cavity reflector corresponding to each respective VECSEL may be configured to define different resonant cavities, thereby producing different laser emission wavelengths 605-608. In some embodiments, external cavity reflector 610 may comprise optical reflective gratings with varying pitch lengths, thereby producing different laser emission wavelengths for each of VECSELs 601-604.

Thus, as seen from the above examples illustrated in FIG. 5 and FIG. 6, embodiments of the invention may be utilized by VCSELs including a single or multiple longitudinal modes.

FIG. 7A is an illustration of a 2D VCSEL array emission format according to an embodiment of the invention. In this embodiment, a VCSEL-based laser low-speckle illuminator includes 2D array of VCSEL emitter elements 700. Said VCSEL emitter elements comprise varying laser emission wavelengths, thereby providing a broad spectral emission range. In this example, wavelengths $\lambda_1$-$\lambda_{10}$ are shown to vary, wherein the full width at half-maximum value (FWHM) of $\lambda$ is ~10 nm.

The number of pixels and the number of unique spectral elements within array 700 is dependent on the power and spectral bandwidth specification of the illuminator. The spectral gradient (i.e., laser emission wavelength variations) within array 700 may be limited to specific orientations. For example, the gradient may span from left to right (or any direction) from short to long wavelengths; radially outward, or a completely random pattern. The array may also be divided into groupings or sections across the array with unique wavelengths. It is also to be understood that the shape of array 700 is arbitrary, and may comprise other shapes in other embodiments (e.g., circular, square, etc).

In some embodiments of the invention, techniques to engineer a certain wavelength gradient or pattern into VCSEL array 700 for low-speckle using growth approaches include using non-rotation growth techniques, thermal gradient growth control, patterned or selective area growth, or combinations of the aforementioned growth techniques.

Figure 7B:
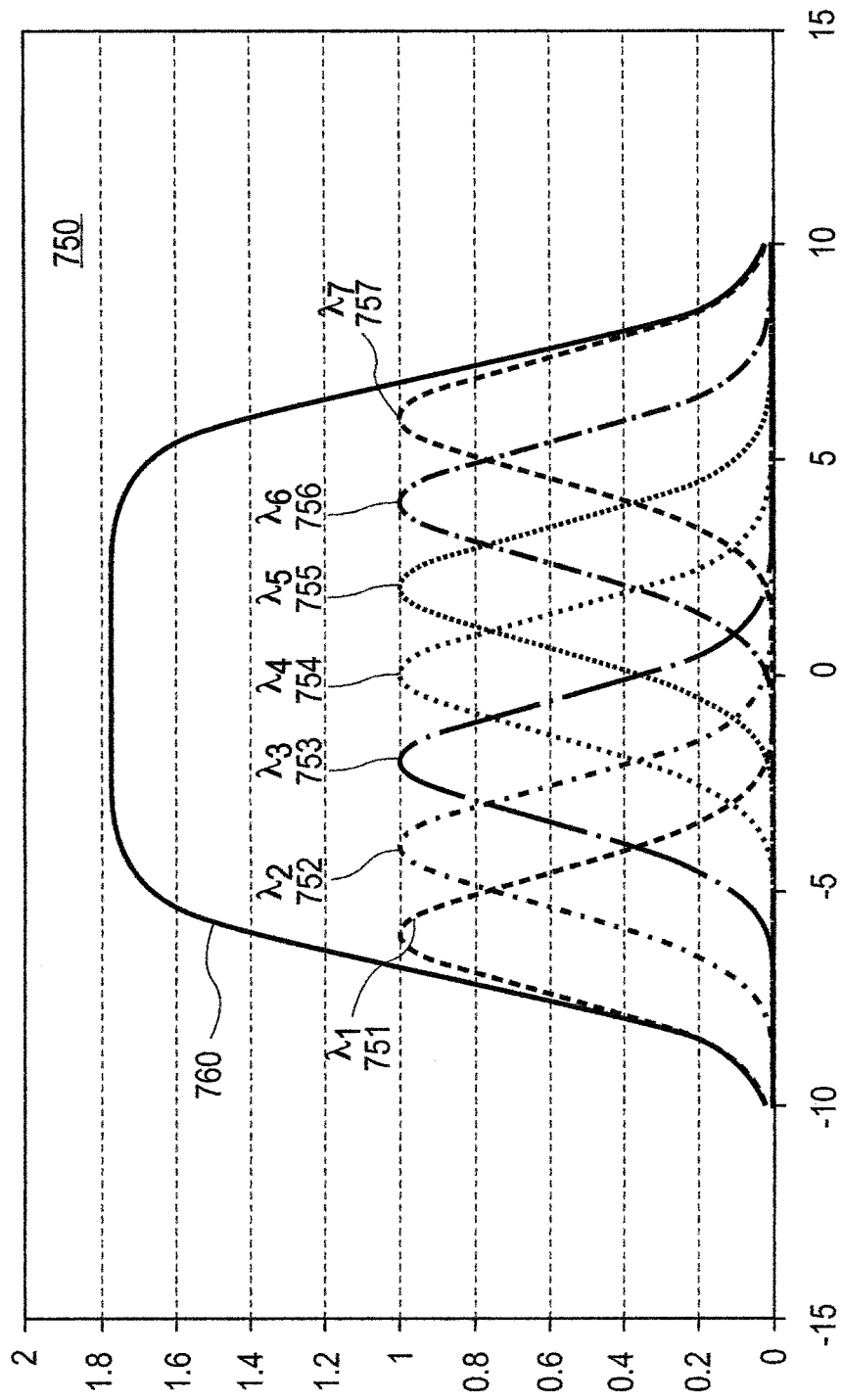
FIG. 7B is an intensity/wavelength spectra diagram for a VCSEL array formed according to an embodiment of the invention.

FIG. 7B is an intensity/wavelength spectra diagram for the VCSEL array described above with respect to FIG. 7A. Diagram 750 is an illustration of 10 nm spectrum from a low-speckle VCSEL illuminator array at one temperature. As shown in this diagram, each of varying laser emission wavelengths (shown as curves 751, 752, 753, 754, 755, 756 and 757) combine to provide a wide light source of increased intensity, represented by curve 760.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus comprising:
   an illuminator having a light source configured to originate an illumination beam, wherein the light source comprises a single-chip array of at least four vertical-cavity surface emitting lasers (VCSELs) sharing common electrodes and configured to produce four or more different emission wavelengths to form the illumination beam, including a first VCSEL having a first laser emission wavelength of the four or more different emission wavelengths, and a second VCSEL having a second laser emission wavelength of the four or more different emission wavelengths different than the first laser emission wavelength; and
   an illumination path to direct the illumination beam towards an object, wherein the four or more different emission wavelengths are configured to produce a full-width-half-maximum of between approximately 3 nm and 20 nm for the illumination beam.

2. The apparatus of claim 1, wherein the first VCSEL includes a first laser cavity length and the second VCSEL includes a second laser cavity length different than the first cavity length.

3. The apparatus of claim 1, wherein the first VCSEL includes a first set of mirrors configured to define a first resonant cavity, and the second VCSEL includes a second set of mirrors configured to define a second resonant cavity different than the first resonant cavity.

4. The apparatus of claim 3, wherein the first and second VCSELs each comprise a vertical external cavity surface emitting laser (VECSEL).

5. The apparatus of claim 4, wherein the first and second set of mirrors include mirrors forming an external cavity for both the first and second VECSELs and formed on a single substrate.

6. The apparatus of claim 1, further comprising a distributed Bragg reflector (DBR), wherein the first VCSEL includes a first effective optical path length formed by the DBR, and the second VCSEL includes a second optical path length formed by the DBR and different than the first optical path length.

7. The apparatus of claim 1, wherein the at least four VCSELs are arranged in a two dimensional array having a spectral gradient from relatively short to relatively long wavelengths varying spatially from one side of the array to another, radially outward from a center of the array, randomly across the array, and/or within sub-sections of the array.

8. The apparatus of claim 1, wherein the first VCSEL includes a first emitter diameter and the second VCSEL includes a second emitter diameter different than the first emitter diameter.

9. The apparatus of claim 1, wherein active cavity regions of the first VCSEL and the second VCSEL comprise different refractive indexes.

10. A system comprising:
a power supply;
a power controller;
a light source configured to generate an illumination beam based on power received from the power source and regulated by the power controller, wherein the light source further comprises a single-chip array of at least four vertical-cavity surface emitting lasers (VCSELs) sharing common electrodes and configured to produce four or more different emission wavelengths to form the illumination beam, including a first VCSEL having a first laser emission wavelength of the four or more different emission wavelengths, and a second VCSEL having a second laser emission wavelength of the four or more different emission wavelengths different than the first laser emission wavelength;
an illumination path to direct the illumination beam towards an object; and
a light receiver including one or more photosensitive elements, and imaging optics configured to receive light from the illumination beam reflected from a surface of the object and to image the received light onto the one or more photosensitive elements, wherein the four or more different emission wavelengths are configured to produce a FWHM of between approximately 3 nm and 20 nm for the illumination beam and to reduce a peak to peak speckle noise intensity, as measured by the light receiver, by more than fifty percent as compared to a single emission wavelength illumination beam.

11. The system of claim 10, wherein the first VCSEL includes a first laser cavity length and the second VCSEL includes a second laser cavity length different than the first cavity length.

12. The system of claim 10, wherein the first VCSEL includes a first set of mirrors configured to define a first resonant cavity, and the second VCSEL includes a second set of mirrors configured to define a second resonant cavity different than the first resonant cavity.

13. The system of claim 12, wherein the first and second VCSELs each comprise a vertical external cavity surface emitting laser (VECSEL).

14. The system of claim 13, wherein the first and second set of mirrors include mirrors forming an external cavity for both the first and second VECSELs and formed on a single substrate.

15. The system of claim 10, the light source further comprising:
a distributed Bragg reflector (DBR), wherein the first VCSEL includes a first effective optical path length formed by the DBR, and the second VCSEL includes a second optical path length formed by the DBR and different than the first optical path length.

16. The system of claim 10, wherein the at least four VCSELs are arranged in a two dimensional array having a spectral gradient from relatively short to relatively long wavelengths varying spatially from one side of the array to another, radially outward from a center of the array, randomly across the array, and/or within sub-sections of the array.

17. The system of claim 10, wherein the first VCSEL includes a first emitter diameter and the second VCSEL includes a second emitter diameter different than the first emitted diameter.

18. The system of claim 10, wherein active cavity regions of the first VCSEL and the second VCSEL comprise different refractive indexes.

19. The system of claim 10, wherein the light receiver is sensitive to the near-infrared and/or short-wave infrared spectrum.

20. The system of claim 10, wherein the at least four VCSELs are arranged in a two dimensional array having a circular, square, or pentagonal shape.

* * * * *